(12) United States Patent
Chung

(10) Patent No.: US 7,217,990 B2
(45) Date of Patent: May 15, 2007

(54) TAPE PACKAGE HAVING TEST PAD ON REVERSE SURFACE AND METHOD FOR TESTING THE SAME

(75) Inventor: Ye-Chung Chung, Kyungki-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 15 days.

(21) Appl. No.: 10/753,828

(22) Filed: Jan. 5, 2004

(65) Prior Publication Data
US 2004/0245628 A1 Dec. 9, 2004

(30) Foreign Application Priority Data
Jan. 14, 2003 (KR) .................. 10-2003-0002417

(51) Int. Cl.
*H01L 23/495* (2006.01)

(52) U.S. Cl. ............... 257/668; 257/667; 257/E23.065; 349/150; 349/151

(58) Field of Classification Search ............... 257/667, 257/668, 678, 685, 686, 730, 779, E23.055, 257/E23.065, E23.077; 349/150, 151
See application file for complete search history.

(56) References Cited

U.S. PATENT DOCUMENTS

| | | | | |
|---|---|---|---|---|
| 5,334,857 A | * | 8/1994 | Mennitt et al. | 257/48 |
| 5,357,400 A | * | 10/1994 | Takekawa | 361/704 |
| 5,612,576 A | * | 3/1997 | Wilson et al. | 257/788 |
| 5,654,582 A | * | 8/1997 | Kijima et al. | 257/620 |
| 5,680,191 A | * | 10/1997 | Voisin et al. | 349/150 |
| 5,744,859 A | * | 4/1998 | Ouchida | 257/668 |
| 5,767,571 A | * | 6/1998 | Kimura et al. | 257/668 |
| 5,837,154 A | * | 11/1998 | Okabe et al. | 216/14 |
| 5,900,669 A | * | 5/1999 | Knapp et al. | 257/701 |
| 5,920,115 A | * | 7/1999 | Kimura et al. | 257/668 |
| 6,087,716 A | * | 7/2000 | Ikeda | 257/676 |
| 6,107,679 A | * | 8/2000 | Noguchi | 257/678 |
| 6,300,577 B1 | * | 10/2001 | Tsujii | 174/261 |
| 6,396,557 B1 | * | 5/2002 | Tajima | 349/150 |
| 6,624,520 B1 | * | 9/2003 | Nakamura | 257/778 |

(Continued)

FOREIGN PATENT DOCUMENTS

JP 57162343 A * 10/1982

(Continued)

OTHER PUBLICATIONS

English language abstract of Korean Publication No. 10-0240818.

(Continued)

*Primary Examiner*—Thao X. Le
(74) *Attorney, Agent, or Firm*—Marger Johnson & McCollom, P.C.

(57) ABSTRACT

A tape package in which a test pad is formed on a reverse surface is provided. The test pad is disposed on a reverse surface of a base film through a through hole of the base film. Accordingly, shapes of the test pads are standardized so that a universal probe card can be used. A pitch between the test pads is wide so that the accuracy in an electric test of the tape package is increased. A total length of the tape package is reduced.

1 Claim, 6 Drawing Sheets

U.S. PATENT DOCUMENTS

| | | | |
|---|---|---|---|
| 6,670,696 B2 * | 12/2003 | Toyosawa et al. | 257/667 |
| 6,670,718 B2 * | 12/2003 | Chinda et al. | 257/774 |
| 6,861,284 B2 * | 3/2005 | Higashi et al. | 438/107 |
| 2002/0149102 A1 * | 10/2002 | Hashemi et al. | 257/706 |
| 2002/0162626 A1 * | 11/2002 | Huang et al. | 156/303.1 |

FOREIGN PATENT DOCUMENTS

| | | |
|---|---|---|
| JP | 404363041 * | 12/1992 |
| KR | 10-0240818 | 1/2000 |
| KR | 10-0315138 | 2/2002 |

OTHER PUBLICATIONS

English language abstract of Korean Publication No. 10-0315138.
English Abstract of JP5013498.

* cited by examiner

TAPE PACKAGE HAVING TEST PAD ON REVERSE SURFACE AND METHOD FOR TESTING THE SAME

This application claims the priority of Korean Patent Application No. 2003-2417, filed on Jan. 14, 2003, in the Korean Intellectual Property Office, the disclosure of which is incorporated herein in its entirety by reference.

BACKGROUND OF THE INVENTION

1. Field of the Invention

This disclosure relates to a semiconductor package and, more particularly, to a tape package used in a liquid crystal display (LCD) and a method for testing the same.

2. Description of the Related Art

Recently, rapid development of LCD technology has brought about an advancement in information society. Generally, electrical devices in which an LCD is mounted for information transmission, are required to be thin, lightweight, and small. Thus, semiconductor packages using a new mounting method have been developed in the semiconductor packaging field.

Conventionally, micro ball grid array (m-BGA) packages were mainly used in electrical devices in which an LCD was mounted for information transmission. However, lately, tape packages using a new mounting method are mainly being used. With tape packages, a semiconductor chip is directly attached to a film with a thin tape-like shape. Such tape packages do not use solder balls as an external connection terminal. Instead, a copper interconnection pattern formed on the film is directly attached to a printed circuit board (PCB) or an LCD panel. Generally, examples of the tape packages include a tape carrier package (TCP) or a chip on film (COF) package.

FIG. 1 is a plan view illustration of a film tape package according to the prior art.

Referring to FIG. 1, a copper interconnection pattern 16 is formed on a film 10 of a conventional tape package made of a bendable material, for example polyimide, and a chip paddle 18, to which a semiconductor chip is attached, is formed in the middle of the film 10. The copper interconnection pattern 16 extends a function of the semiconductor chip to the outside and is used as a contact terminal during an electric testing process. Further, the semiconductor chip is attached to the chip paddle 18 of the film 10 through a bump formed on a pad of an active area.

Gear shape holes 12 are formed on the right and left sides of the film 10. The gear shape holes 12 are used to wind a tape package, to which the semiconductor chip is attached, with a winding reel. Further, a cutting slit 14 formed inside the gear shape holes 12 is used to separate the tape package from the film 10.

In FIG. 1, reference character A1 indicates an area where a solder resist is coated. The area A1 prevents the copper interconnection pattern 16 from being oxidized when the copper interconnection pattern 16 is exposed to the outside and prevents a short-circuit of the copper interconnection pattern 16 which can be caused by foreign material. Further, reference character A2 indicates a user area which is cut from the film 10 and then used. Thus, in the tape package, which is transferred to a user in a state where the tape package is wound on a winding reel, the user cuts only the user area A2 so that the tape package is used as an LCD driving semiconductor package.

In FIG. 1, reference characters B1 and B2 indicate an external connection terminal. The external connection terminals B1 and B2 are used as adhesives, which are anisotropic and have conductivity, and are directly attached to a PCB or an LCD panel. Different from other kinds of semiconductor packages, the tape package can be mounted in a PCB or an LCD panel in a bent state, since the film 10 is made of a material which is bent easily.

Further, reference characters TP1 and TP2 indicate test pads. The test pads TP1 and TP2 are positioned outside the user area A2 and contact a needle of a probe card to test electric functionality of the tape package. Thus, a total length where one tape package occupies the film 10 is a length L1 including the length of the user area A2 and the lengths of the test pads TP1 and TP2.

The tape package according to prior art has the following problems, which are described with reference to FIGS. 1 and 2. FIG. 2 is a cross-sectional illustration of the tape package of FIG. 1 mounted to a chip.

Referring to FIG. 2, in a tape package 20 according to the prior art, a semiconductor chip 30 is attached to a copper interconnection pattern 26 of a film 10 at a bump 34, and an active area of the semiconductor chip 30 is encapsulated by an encapsulant 32. The film 10 has a cross-sectional structure that includes a base substrate 22 made of a bendable material, for example polyimide, and the copper interconnection pattern 26 laminated on a base substrate 22 using an adhesive 24.

Test pads TP1 and TP2 are cut to be separated from the tape package 20. The copper interconnection pattern 26 formed on an upper surface of the film 10 is coated with a solder resist 28 except in an area where external connection terminals B1 and B2 are formed.

Since the copper interconnection pattern 16 is formed only on one surface of the film 10, that is, the test pads TP1 and TP2 are positioned outside the user area A2, the total length L1 of the tape package becomes longer. Thus, an amount of film 10 used for manufacturing one tape package increases. In addition, since the copper interconnection pattern 16 is formed, manufacturing costs of the tape package increases.

Also, when the copper interconnection pattern 16 is cut in a process for separating the user area A2, a defect such as a burr occurs in the copper interconnection pattern 16, resulting in a short-circuit of the copper interconnection pattern 16 adjacent to the burr.

Further, different sized probe cards must be used according to a pitch between the test pads and the size of the user area in a process for testing an electric functionality of the tape package. Since in the conventional tape package, the copper interconnection pattern 16 is formed on only one surface of the film, a universal probe card cannot be used. Thus, a large number of different sized probe cards are required.

Embodiments of the invention address these and other problems in the prior art.

SUMMARY OF THE INVENTION

Embodiments of the present invention provide a tape package with a test pad on a reverse surface, in which a total length of the tape package occupying a film is reduced by changing a structure of a test pad from a planar structure to a three dimensional structure. Short-circuiting due to a burr created in a sawing process is prevented and an inexpensive probe card can be used as a universal probe card. Embodiments of the present invention also provide methods for testing the tape package having the test pad on the reverse surface.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Embodiments of the present invention will now be described more fully with reference to the attached drawings. This invention may, however, be embodied in many different forms and should not be construed as being limited to the embodiments set forth herein. Rather, these embodiments are provided so that this disclosure will be thorough and complete and will fully convey the concept of the invention to those of ordinary skill in the art. A test pad referred to in the present invention should not be construed as being limited to the embodiments set forth herein.

Various changes in the present invention may be made therein without departing from the spirit and scope of the present invention as defined by the appended claims. For example, although a test pad is formed on a reverse surface of a film, the test pad may be modified and then applied in the embodiments of the invention. Thus, the contents disclosed in the embodiments of the invention are regarded to be of an illustrative rather than restrictive sense.

Figure 1:
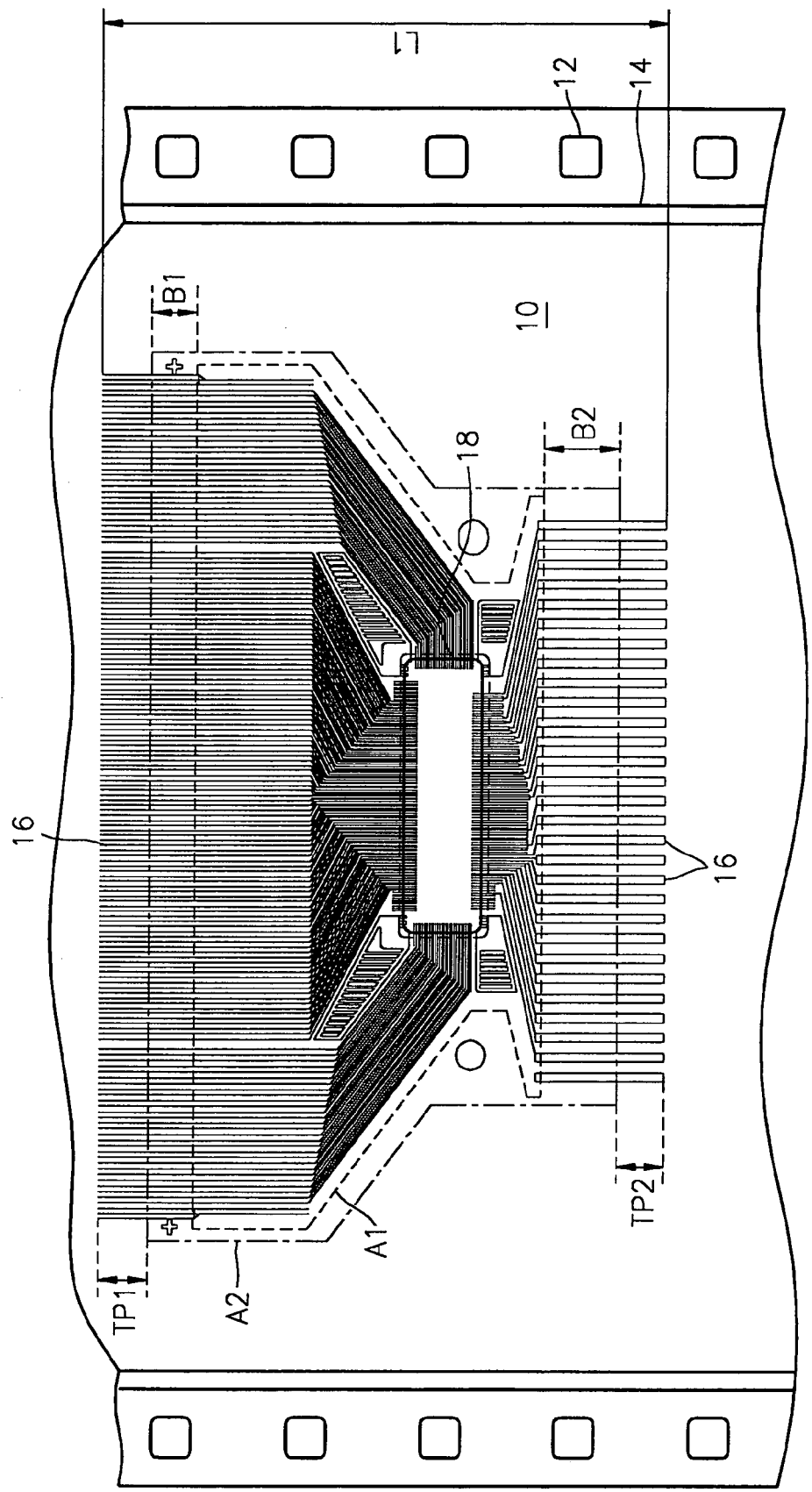
FIG. 1 is a plan view illustration of a film of a tape package according to prior art.
Figure 2:
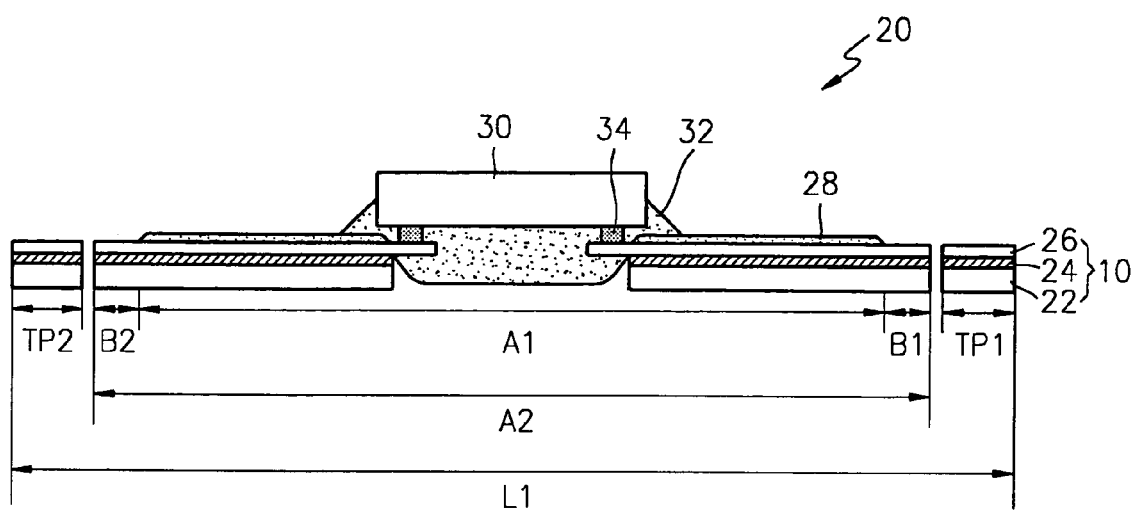
FIG. 2 is a cross-sectional diagram for explaining a structure of a tape package according to prior art.
Figure 3:
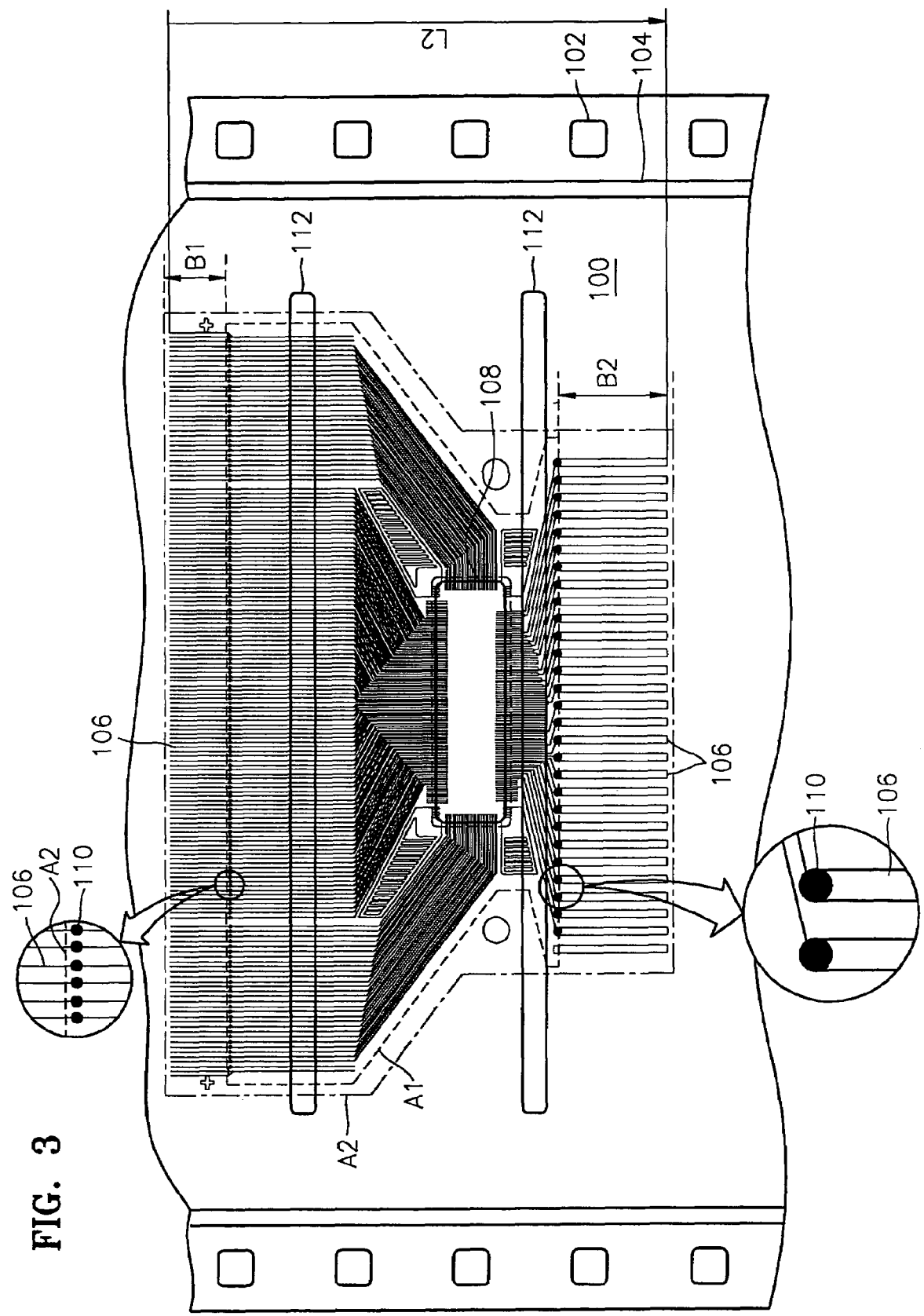
FIG. 3 is a plan view illustration of a film of a tape package according to an embodiment of the present invention.

FIG. 3 is a plan view illustration of a film 100 of a tape package according to an embodiment of the present invention. Referring to FIG. 3, the film 100 used in the tape package includes a base substrate made of a bendable material, for example polyimide or epoxy-based resin, as in a film used in a conventional tape package. A copper interconnection pattern 106 is formed on the base substrate, and a chip paddle 108 to which a semiconductor chip is attached is formed in the middle of the film 100. A bending slit 112 is formed on the base substrate to increase the bending capability of the tape package so that the tape package can be mounted in an LCD panel or a PCB in a bent state.

The copper interconnection pattern 106 extends a function of the semiconductor chip externally and is used as a contact terminal in an electric testing process. Further, the semiconductor chip is attached to the chip paddle 108 of the film 100 through a bump formed on a pad of an active area (not shown).

Gear shaped holes 102 are formed on the right and left sides of the film 100. The gear shape holes 102 are used to wind the tape package, to which the semiconductor chip is attached, with a winding reel. Further, a cutting slit 104 formed inside the gear shape holes 102 is used to separate the tape package from the film 100.

An area A1 where a solder resist is coated is separate from a portion where the external connection terminals B1 and B2 are formed in a user area A2. The user area A2 is cut by a user and separated to be used as an LCD driving integrated circuit (IC).

Figure 4:
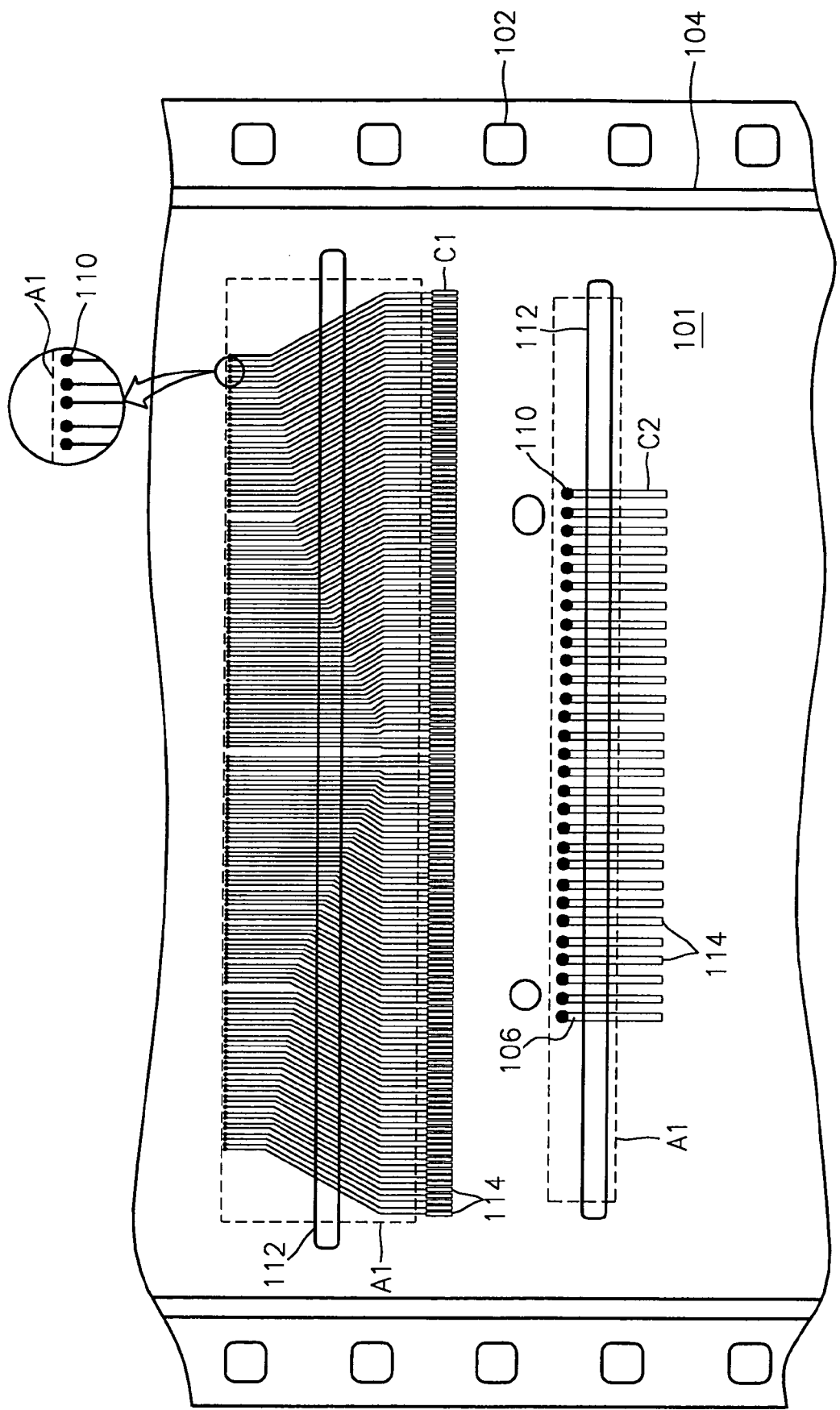
FIG. 4 is a bottom view illustration of a film of a tape package according to an embodiment of the present invention.

However, in the film 100, a test pad 114, shown in FIG. 4, is not formed on an upper surface of the film 100. The test pad is instead formed on a reverse surface of the film 100 through a through hole 110. Thus, since a test pad does not need to be formed outside of the user area A2, a length L2 of the tape package occupying the film 100 is reduced in comparison to prior art. As a result, more tape packages can be formed on the same sized film. Further, the copper interconnection pattern 106 is not formed at an end of the user area A2 which is cut, that is, at an end of the external connection terminals B1 and B2. As a result, no burrs occur at the end of the user area A2. Thus, short-circuiting of the copper interconnection pattern 106 due to the burrs can be prevented.

FIG. 4 is a bottom view illustration of a film 101 of a tape package of FIG. 3.

Referring to FIGS. 3 and 4, test pads 114 formed on a reverse surface of the film 101 through a through hole 110 can extend further within a user area A2. That is, a pitch between the test pads 114 can be adjusted to be set more widely apart. Ultimately, it is possible to apply the same pitch between the test pads 114 to all types of tape packages.

Currently, the type of a probe card used in an electric test for a tape package is different according to a pitch between test pads, a pitch between first rows C1 and a pitch between second rows C2, because needles installed in the probe card in a fixed pattern must physically contact the test pads. Thus, when the pitch between the test pads is different or the pitch between the first rows C1 and the pitch between the second rows C2 are different, various kinds of expensive probe cards must be used individually according to the condition.

In the prior art, the use of a universal probe card is limited because the copper interconnection pattern and the test pad must be installed on only the upper surface of the film. However, in embodiments of the invention, since the test pads 114 are formed on the reverse surface of the film 101 through the through hole 110, the above-described problem of multiple probe cards can be solved. That is, since the pitch between the test pads 114 can be wide enough and kept the same across many tape packages, and the pitch between the first rows C1 and the pitch between the second rows C2 can be kept the same across many tape packages, the above-described problem of multiple probe cards can be solved. Thus, when the pitch between the test pads 114 is not different or the pitch between the first rows C1 and the pitch between the second rows C2 are not different, specialty kinds of probe cards need not be used. Instead, a universal probe card can contact the test pads 114 formed on the reverse surface of the film 101. Therefore, costs incurred by using a large number of expensive probe cards is reduced.

The copper interconnection pattern 106 is formed on an upper surface of the film 101 so as to widen the pitch between the test pads 114 and is coated with a solder resist A1 so that the solder resist A1 prevents the copper interconnection pattern 106 from oxidizing, and prevents short-circuiting of the copper interconnection pattern 106 caused by contacting a foreign material. The solder resist A1 is not coated on the test pad 114 where the needles of a probe card would not contact the test pad 114.

Figure 5:
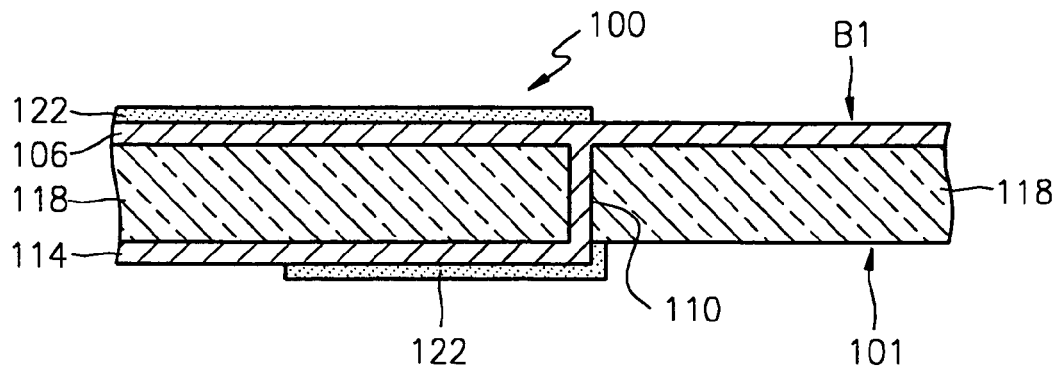
FIGS. 5 and 6 are cross-sectional view illustrations of a test pad formed on a reverse surface of a tape package according to an embodiment of the present invention.
Figure 6:
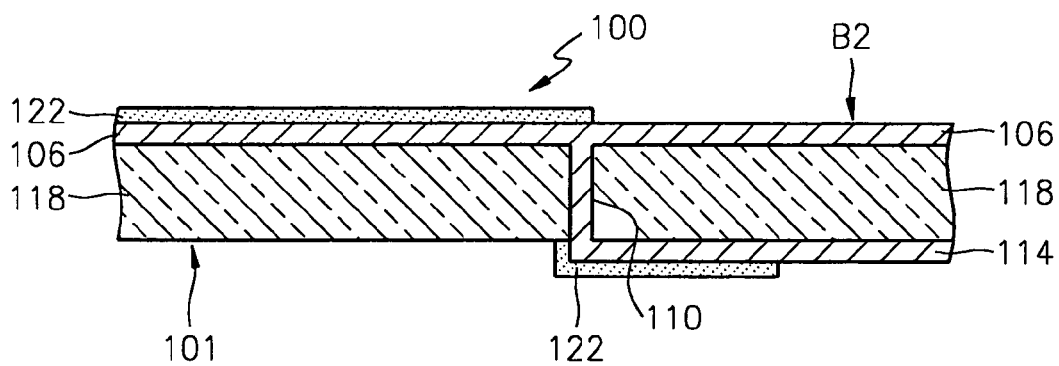

FIGS. 5 and 6 are cross-sectional illustrations of a test pad formed on a reverse surface of a tape package according to an embodiment of the present invention. FIG. 5 is a cross-sectional illustration of a portion B1 in FIG. 3 after the tape package is cut and separated into an individual package. FIG. 6 is a cross-sectional illustration of a portion B2 in FIG. 3 after the tape package is cut and separated into an individual package. In FIGS. 5 and 6, reference numeral 118 indicates a base substrate made of polyimide or epoxy-based resin, reference numeral 106 indicates a copper interconnection pattern, and reference numeral 122 indicates a solder resist which is an insulating substance.

Figure 7:
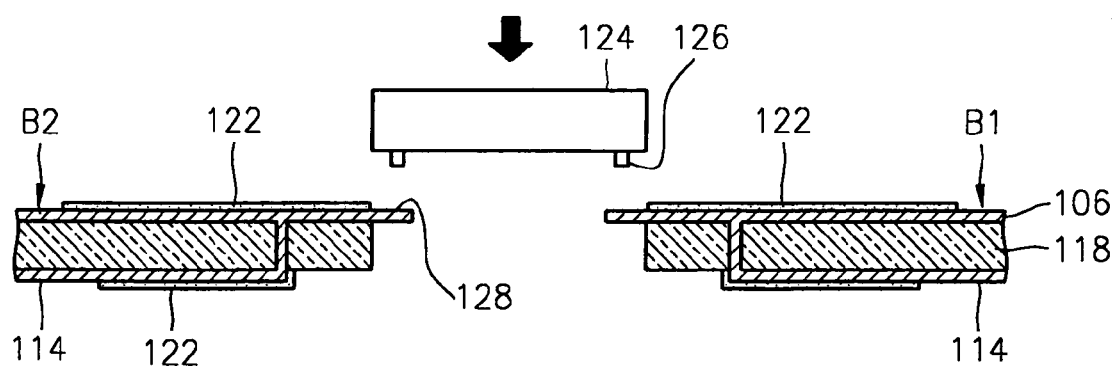
FIGS. 7 and 8 are cross-sectional view illustrations showing a method of attaching a semiconductor chip of a tape package according to another embodiment of the present invention.
Figure 8:
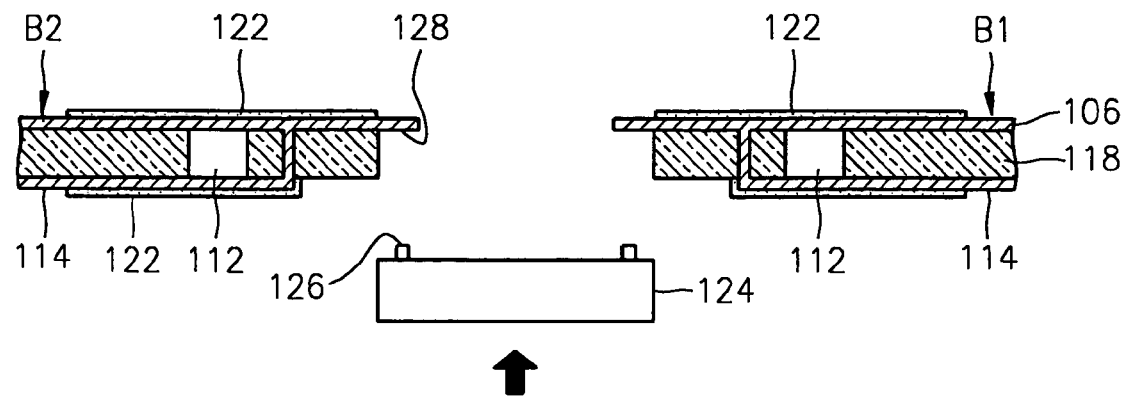

FIGS. 7 and 8 are cross-sectional illustrations for explaining a method of attaching a semiconductor chip of a tape package according to another embodiment of the present invention.

Referring to FIGS. 7 and 8, a semiconductor chip 124 can be attached to a front surface (FIG. 7) or a reverse surface (FIG. 8) of a film. It is preferable that a portion of a copper interconnection pattern 106 of the film where a bump of the semiconductor chip 124 contacts is surface-treated. The surface treatment is performed for easily attaching the bump and the copper interconnection pattern 106, and is carried out by plating a surface of the copper interconnection pattern 106 with Au or Sn.

The copper interconnection pattern 106 may be formed by being laminated on a base substrate 118 using an adhesive. Alternatively, the copper interconnection pattern 106 may be formed by being sputtered on the base substrate 118.

Figure 9:
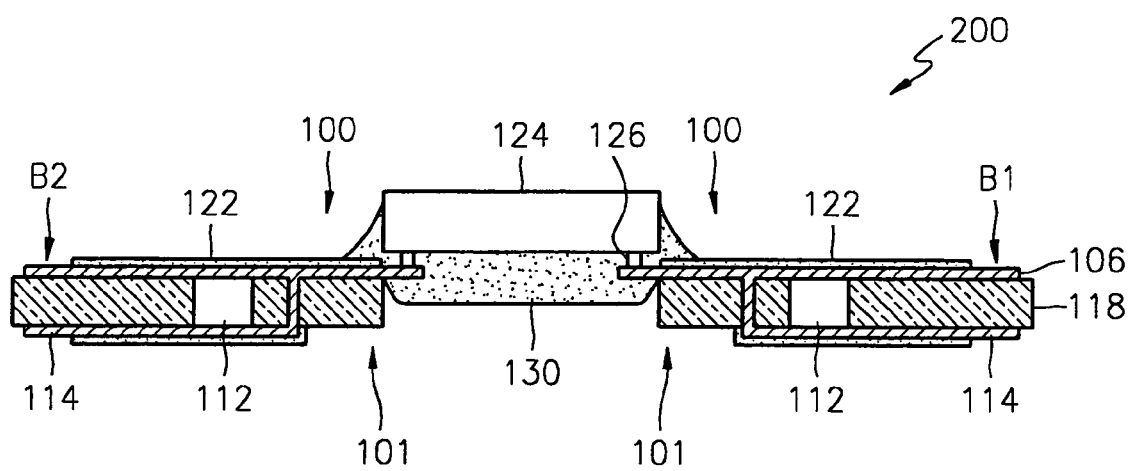
FIG. 9 is a cross-sectional view illustration showing a structure of a tape package according to an embodiment of the present invention.

FIG. 9 is a cross-sectional illustration for explaining a structure of a tape package according to an embodiment of the present invention. Referring to FIG. 9, a tape package 200 has a test pad 114 that is formed on a reverse surface includes films 100 and 101. The films 100 and 101 each include a base substrate 118 which has a through hole formed therein and is made of an insulating material having flexibility, a copper interconnection pattern 106 formed on the base substrate 118, and a solder resist 122 covering the entire copper interconnection pattern 106.

The tape package 200 includes a semiconductor chip 124 which is attached to the copper interconnection pattern 106 of the film 100 through a bump 126 in a flip chip form.

The tape package 200 includes an encapsulant 130 for covering an exposed portion of the semiconductor chip 124.

The tape package 200 includes a test pad 114 which is connected to the copper interconnection pattern 106 through the through hole formed in the base substrate 118 of the film 100 and is extended to a reverse surface of the film 101. In FIG. 9, a bending slit 112 is an empty portion not including a bendable material such as polyimide. Thus, when external connection terminals B1 and B2 are attached to an LCD panel or a PCB, the tape package can be mounted in the LCD panel or the PCB by bending the bending slit 112.

Particular embodiments of the invention will now be described in a non-limiting way. According to one embodiment of the invention, a tape package has a test pad on a reverse surface. The embodiment has a film which includes a base substrate with a through hole formed therein, and is made of a flexible insulating material. The film has a copper interconnection pattern formed on the base substrate and a solder resist covering the entire copper interconnection pattern. A semiconductor chip is connected to the copper interconnection pattern of the film in a flip chip form. An encapsulant covers an exposed portion of the semiconductor chip. And, a test pad is connected to the copper interconnection pattern through the through hole formed in the base substrate of the film and extends to a reverse surface of the film.

The flexible insulating material may be polyimide or epoxy-based resin, for instance. A bending slit may be formed on the base substrate to increase bending capability of the tape package.

The copper interconnection pattern and the test pad may be formed on the base substrate using a laminating method or a sputtering method, and the test pad formed on the reverse surface of the film widely extends within a user area to widen a pitch between the test pads.

According to another embodiment of the present invention, the test pad formed on the reverse surface of the film is manufactured to conform to regular standards regardless of the type of tape package so as to allow use of a universal probe card in an electric test of the tape package. For example, the pitch between the test pads may be regular, and the pitch between first rows and the pitch between second rows may be regular.

A portion of the test pad, except a portion where a needle of the probe card contacts, may be coated with the solder resist.

Another aspect of the invention is a method for testing a tape package. The method includes preparing a tape package in which test pads are formed on a reverse surface, contacting needles of a probe card to the reverse surface of the tape package, the probe card being manufactured to conform to regular standards regardless of the type of tape package, and testing the electric functionality of the tape package by contacting the needles of the probe card to the reverse surface of the tape package.

The pitch between the test pads formed on the reverse surface of the tape package may extend wider than a pitch between copper interconnection patterns formed on an upper surface of the tape package. Further, the needles of the probe card may be installed at a regular pitch regardless of the type of tape package, and the lengths of first row needles and the lengths of second row needles in the probe card may be the same as one another regardless of the type of tape package.

The tape package may be a tape carrier package (TCP) or a chip on film package (COF), for instance.

The total length of a tape package occupying a film is reduced so that manufacturing costs of the tape package can be reduced. Also, burrs are prevented from occurring in a sawing process so that short-circuiting of a copper interconnection pattern can be prevented. Further, the pitch between test pads, the pitch between first rows, and the pitch between second rows on the reverse surface of the tape package are formed regularly within a user area so that a universal probe card can be used.

An example method of electrically testing a tape package, in which a test pad is formed on a reverse surface, is as follows.

First, a tape package, in which a test pad is formed on a reverse surface as shown in FIG. 9, is prepared. The test pad and a signal line adjacent to it can be formed at a regular pitch therebetween, and simultaneously, a pitch between first rows and a pitch between second rows can be kept regular. Thereafter, a universal probe card manufactured so as to be suitable to the pitches is prepared. Finally, needles of the universal probe card contact the test pad of the tape package to perform an electric test.

As described above, according to the present invention, first, since a total length of a tape package occupying a film is reduced, manufacturing costs of the tape package can be reduced. Second, since a burr is prevented from occurring in a sawing process, short-circuiting of a copper interconnection pattern can be prevented. Third, since a pitch between test pads, a pitch between first rows, and a pitch between second rows on a reverse surface of the tape package are formed regularly within a user area, a universal probe card can be used.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A tape package comprising:
   a flexible thin-film substrate having a plurality of gear shaped holes are formed therethrough;
   an external interconnection semiconductor chip lead wiring pattern formed on a first surface of the substrate;
   a pair of exposed test pads formed on a second surface of the substrate;
   a user area that extends through the substrate, the user area defining a semiconductor package cut from the flexible film substrate, wherein the pair of exposed test pads are formed within the user area and the external interconnection semiconductor chip lead wiring pattern terminates within the user area;
   a pair of through holes formed through the flexible thin-film substrate, each through hole electrically connecting the external interconnection semiconductor chip lead wiring pattern to one of the test pads; and
   a semiconductor chip disposed between the pair of through holes such that the through holes are disposed on opposite sides of the semiconductor chip.

* * * * *